(12) United States Patent
Ichiyama et al.

(10) Patent No.: US 7,724,811 B2
(45) Date of Patent: May 25, 2010

(54) DELAY CIRCUIT, JITTER INJECTION CIRCUIT, AND TEST APPARATUS

(75) Inventors: Kiyotaka Ichiyama, Tokyo (JP); Masahiro Ishida, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 837 days.

(21) Appl. No.: 11/535,296

(22) Filed: Sep. 26, 2006

(65) Prior Publication Data

US 2008/0092000 A1    Apr. 17, 2008

(51) Int. Cl.
*H04B 3/46* (2006.01)
*H04B 17/00* (2006.01)
*H04Q 1/20* (2006.01)

(52) U.S. Cl. ........................ 375/224; 375/226; 324/765

(58) Field of Classification Search ................. 375/224, 375/226; 324/765
See application file for complete search history.

(56) References Cited

U.S. PATENT DOCUMENTS

| | | | | |
|---|---|---|---|---|
| 5,054,038 | A * | 10/1991 | Hedberg | 375/371 |
| 6,194,932 | B1 * | 2/2001 | Takemae et al. | 327/158 |
| 6,285,197 | B2 * | 9/2001 | Walker | 324/603 |
| 6,642,801 | B1 * | 11/2003 | Zortea et al. | 331/57 |
| 6,671,652 | B2 * | 12/2003 | Watson et al. | 702/177 |
| 7,142,998 | B2 * | 11/2006 | Watson et al. | 702/69 |
| 7,212,021 | B2 * | 5/2007 | Karnik et al. | 324/765 |
| 7,319,349 | B2 * | 1/2008 | Tomita | 327/144 |
| 7,321,249 | B2 * | 1/2008 | Watanabe et al. | 327/251 |
| 7,382,117 | B2 * | 6/2008 | Suda et al. | 324/158.1 |
| 7,518,422 | B2 * | 4/2009 | Johnson | 327/158 |
| 7,564,284 | B2 * | 7/2009 | Henzler et al. | 327/261 |
| 2001/0011893 | A1 | 8/2001 | Walker | |
| 2005/0116759 | A1 | 6/2005 | Jenkins et al. | |
| 2007/0098128 | A1 * | 5/2007 | Ishida et al. | 375/376 |

FOREIGN PATENT DOCUMENTS

JP    6-112785    4/2006
JP    2007217377    8/2007

OTHER PUBLICATIONS

International Search Authority/JP. International Search Report dated Sep. 26, 2006. International Application No. PCT/JP2007/068423. International Filing Date: Sep. 21, 2007. Form PCT/ISA/210. Japanese Language. 2 pages.
International Search Authority/JP. International Search Report dated Oct. 23, 2007. International Application No. PCT/JP2007/068423. International Filing Date: Sep. 21, 2007. Form PCT/ISA/237. Japanese Language. 3 pages.

* cited by examiner

*Primary Examiner*—Jean B Corrielus
(74) *Attorney, Agent, or Firm*—Sterne, Kessler, Goldstein & Fox P.L.L.C.

(57) ABSTRACT

There is provided a delay circuit that delays and outputs a given input signal. The delay circuit includes a first delaying section that delays the input signal, a second delaying section that further delays the input signal delayed by the first delaying section, and a delay setting section that sets a time delay in the second delaying section at a timing delayed by a predetermined time to a timing setting a time delay in the first delaying section.

11 Claims, 11 Drawing Sheets

DELAY CIRCUIT, JITTER INJECTION CIRCUIT, AND TEST APPARATUS

BACKGROUND

1. Field of the Invention

The present invention relates to a delay circuit, a jitter injection circuit, and a test apparatus. More particularly, the present invention relates to a jitter injection circuit capable of injecting a jitter with high frequency and large amplitude to an input signal.

2. Related Art

As a circuit injecting a jitter into an input signal, a circuit making use of a variable delay element is considered as disclosed in Japanese Patent Application Publication No. 2006-41640. For example, it is possible to inject a jitter into an input signal by including a variable delay element for delaying the input signal and a control section for controlling a delay amount in the variable delay element and changing the delay amount in the variable delay element according to the jitter to be injected.

Moreover, jitter amplitude capable of being injected is determined by variable delay range of the variable delay element. For this reason, when injecting a jitter of large amplitude, it is possible to realize a large variable delay range as a whole circuit by cascading variable delay elements, each of which a split delay-control signal is fed into.

For example, when a sinusoidal jitter of large amplitude is injected into the input signal, a time delay of each variable delay element is varied from a predetermined reference time delay according to the sinusoid. A period of the delay control signal to be split and fed into each variable delay element corresponds to a period of the sinusoidal jitter to be injected.

When each variable delay element generally uniformly delays a predetermined edge of the input signal according to the jitter to be injected, it is possible to add the time delays in the variable delay elements and inject the sinusoidal jitter of large amplitude into the input signal.

Here, when a time delay generated from one variable delay element is sufficiently small in comparison with the period of the delay control signal, a variation in time delay of the delay control signal, which is required for a predetermined edge of the input signal during the time interval between being input into a variable delay element and being output into the next variable delay element, is also sufficiently small. In this case, it can be considered that a level of the delay control signal given to each variable delay element is a generally same level according to amplitude of the jitter to be injected. For this reason, it is possible to inject the jitter of large amplitude into the input signal.

On the other hand, when a time delay generated from one variable delay element is not sufficiently small in comparison with the period of the delay control signal, an amplitude of the delay control signal is varied while the input signal propagates trough one single stage in the variable delay elements. For this reason, it is difficult to inject a jitter with desired amplitude into the input signal. Particularly, when injecting a jitter with high jitter frequency, a time delay injected in a positive direction with respect to the reference time delay and a time delay injected in a negative direction with respect to the reference time delay may be cancelled with each other, and thus it is difficult to inject a jitter with high jitter frequency and large amplitude.

Moreover, when a jitter test is performed on a device under test such as a semiconductor circuit by means of the jitter injection circuit, it is impossible to perform the test with high precision.

SUMMARY

Therefore, it is an object of one aspect of the present invention to provide a delay circuit, a jitter injection circuit, and a test apparatus that can solve the foregoing problems. The above and other objects can be achieved by combinations described in the independent claims. The dependent claims define further advantageous and exemplary combinations of the present invention.

That is, according to the first aspect of the present invention, there is provided a delay circuit that delays and outputs a given input signal. The delay circuit includes: a first delaying section that delays the input signal; a second delaying section that further delays the input signal delayed by the first delaying section; and a delay setting section that sets a time delay in the second delaying section at a timing delayed by a predetermined time to a timing setting a time delay in the first delaying section.

According to the second aspect of the present invention, there is provided a jitter injection circuit that injects and outputs jitter to an input signal. The jitter injection circuit includes: a delay circuit that delays and outputs the input signal; and a jitter generating section that generates a delay control signal controlling a time delay in the delay circuit according to jitter to be injected to the input signal, in which the delay circuit includes: a first delaying section that delays the input signal by a time delay according to the delay control signal; a second delaying section that further delays the input signal delayed by the first delaying section by the time delay according to the delay control signal; and a delay setting section that sets a time delay in the second delaying section at a timing delayed by a predetermined time to a timing setting a time delay in the first delaying section.

According to the third aspect of the present invention, there is provided a test apparatus that tests a device under test. The test apparatus includes: a signal generating section that generates a test signal to be input into the device under test; a jitter injection circuit that injects jitter to the test signal to input the injected signal into the device under test; and a deciding section that evaluates the device under test based on a signal output from the device under test according to the test signal, in which the jitter injection circuit includes: a delay circuit that delays and outputs the test signal; and a jitter generating section that generates a delay control signal controlling a time delay in the delay circuit according to jitter to be injected to the test signal, and the delay circuit includes: a first delaying section that delays the test signal by a time delay according to the delay control signal; a second delaying section that further delays the test signal delayed by the first delaying section by the time delay according to the delay control signal; and a delay setting section that sets a time delay in the second delaying section at a timing delayed by a predetermined time to a timing setting a time delay in the first delaying section.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
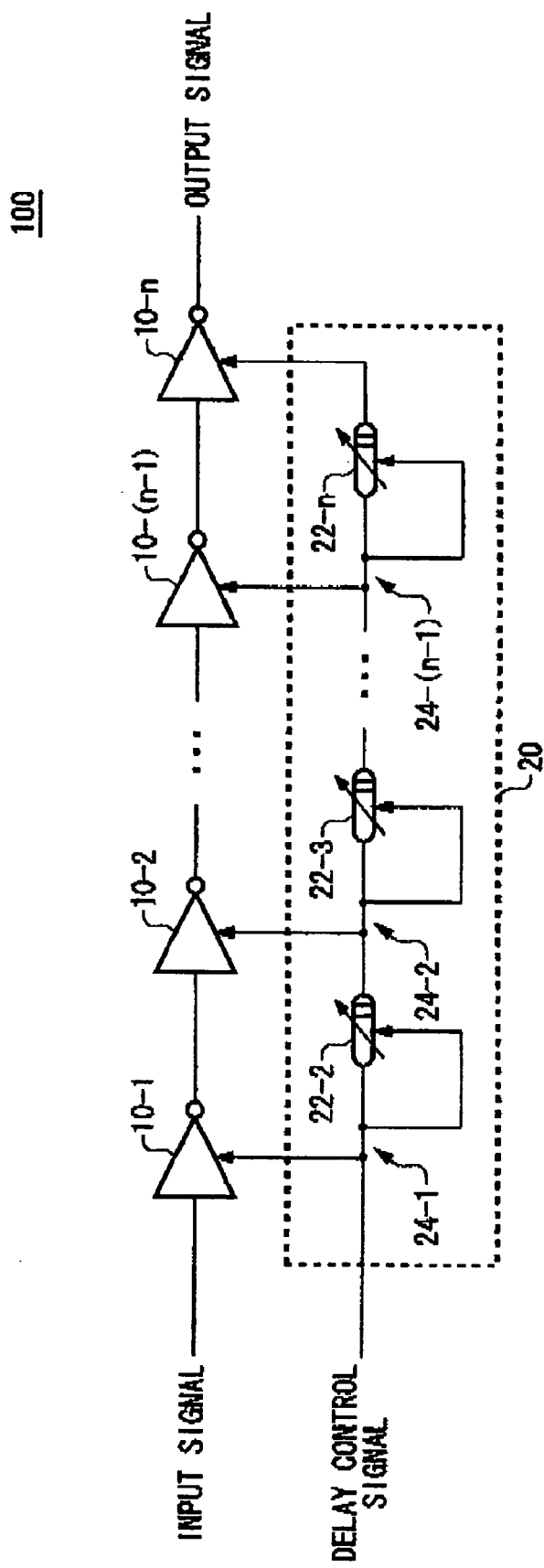
FIG. 1 is a view exemplary showing a configuration of a delay circuit 100 according to one embodiment of the present invention.

FIG. 1 is a view exemplary showing a configuration of a delay circuit 100 according to one embodiment of the present invention. The delay circuit 100 is a circuit for delaying and outputting a given input signal, and includes a plurality of delaying sections 10 (a first delaying section 10-1, a second delaying section 10-2, ..., and a n-th delaying section 10-n, and n is an integer not less than two) and a delay setting section 20. It is possible to inject jitter to the input signal by dynamically controlling a time delay in the delay circuit 100.

Each of the delaying sections 10 is cascaded and further delays and outputs the input signal delayed by the preceding delaying section 10. Each of the delaying sections 10 may be the same delay element. Moreover, it is preferable that a relation between a given delay control signal and a generated time delay is generally same in each delaying section 10.

The delay setting section 20 controls a time delay in each delaying section 10 based on the given delay control signal. In this example, this delay control signal is input into each delaying section 10 to control the time delay. For example, when the delaying section 10 is an inverter or the like, the time delay may be controlled by supplying a power supply voltage to the delaying section 10 according to this delay control signal. In this case, the delay control signal may be an analog signal. Moreover, when the delaying section 10 is a circuit that controls the time delay by selecting a path transmitting a signal, the time delay may be controlled by selecting this path based on this delay control signal. In this case, the delay control signal may be a digital signal.

The delay setting section 20 sets a time delay in each delaying section 10 with a timing delayed by a predetermined time with respect to a time delay set in the preceding delaying section 10 of this delaying section 10. For example, a time delay is set in the second delaying section 10-2 at a timing delayed by a predetermined time with respect to a timing setting a time delay in the first delaying section 10-1. The delay setting section 20 of the present example supplies a delay control signal according to a time delay to be generated from the delay circuit 100 to the first delaying section 10-1, and delays the delay control signal by the predetermined time to supply the delayed signal to the second delaying section 10-2.

By such a process, it is possible to reduce a phase difference between the input signal and the delay control signal in each delaying section 10. In other words, it is possible to reduce a difference between a time delay to be generated from each delaying section 10 for a predetermined edge of the input signal and a time delay actually generated from the delaying section 10. For this reason, it is possible to control amplitude of the jitter injected to the input signal with high precision. Moreover, it is possible to prevent the time delays in the delaying sections 10 from being cancelled with each other and input the jitter of high frequency and large amplitude into the input signal.

However, when a time delay between a timing inputting the delay control signal into the preceding delaying section 10 and a timing inputting the delay control signal into the subsequent delaying section 10 is extremely large, a phase difference between the input signal and the delay control signal becomes large due to this tiring delay. For example, the time delay at this timing may be, for example, smaller than a maximum time delay of the delaying sections 10.

Moreover, the delay setting section 20 in the present example has a plurality of variable delay elements (22-2, 22-3, ..., and 22-n, and hereinafter, generically referred to as 22) for delaying the delay control signal according to the time delay in the previous delaying section 10 and supplying the delayed signal to each delaying section 10. The plurality of variable delay elements 22 is provided corresponding to the plurality of delaying sections 10 with one-to-one correspondence, and supplies the delay control signal to the corresponding delaying sections 10. However, the variable delay element 22 for the first delaying section 10-1 may not be provided.

Each of the variable delay elements 22 receives the split delay control signal being input into the preceding delaying section 10 of the corresponding delaying section 10. For example, the variable delay element 22 being input into the second delaying section 10-2 receives the split delay control signal being input into the first delaying section 10-1.

Moreover, each of the variable delay elements 22 delays the received delay control signal by a time delay according to this delay control signal to input the delayed control signal into the corresponding delaying section 10. The delay setting section 20 in the present example has splitter sections (24-1, 24-2, ..., and 24-(n−1), and hereinafter, generically referred to as 24) for splitting the delay control signal supplied to each delaying section 10 and controlling a time delay in the next variable delay element 22 based on the split delay control signal. The splitter sections 24 are provided corresponding to the plurality of delaying sections 10 with one-to-one correspondence. However, the splitter section 24 may not be provided for the last delaying section 10-n.

Each variable delay element 22 in the present example delays the received delay control signal by the time delay substantially equal to that in the previous delaying section 10 of the corresponding delaying section 10, in order to input the delayed control signal into the corresponding delaying section 10. By such a configuration, it is possible to substantially uniform the time delays caused by the delaying sections 10 for the predetermined edge of the input signal. For this reason, it is possible to control the amplitude of the jitter injected into the input signal with high precision. Furthermore, it is possible to prevent the time delays generated from the delaying sections 10 from being cancelled with each other and inject the jitter of high frequency and large amplitude to the input signal.

Moreover, the delaying section 10 may be a circuit chip having a plurality of delay elements. For example, each of the delaying sections 10 may be a delay circuit chip having a plurality of inverters. The same delay control signal may be split to the plurality of delay elements included in this delay circuit chip. Moreover, each delay circuit chip may have a configuration similar to that of the delay circuit 100.

Figure 2:
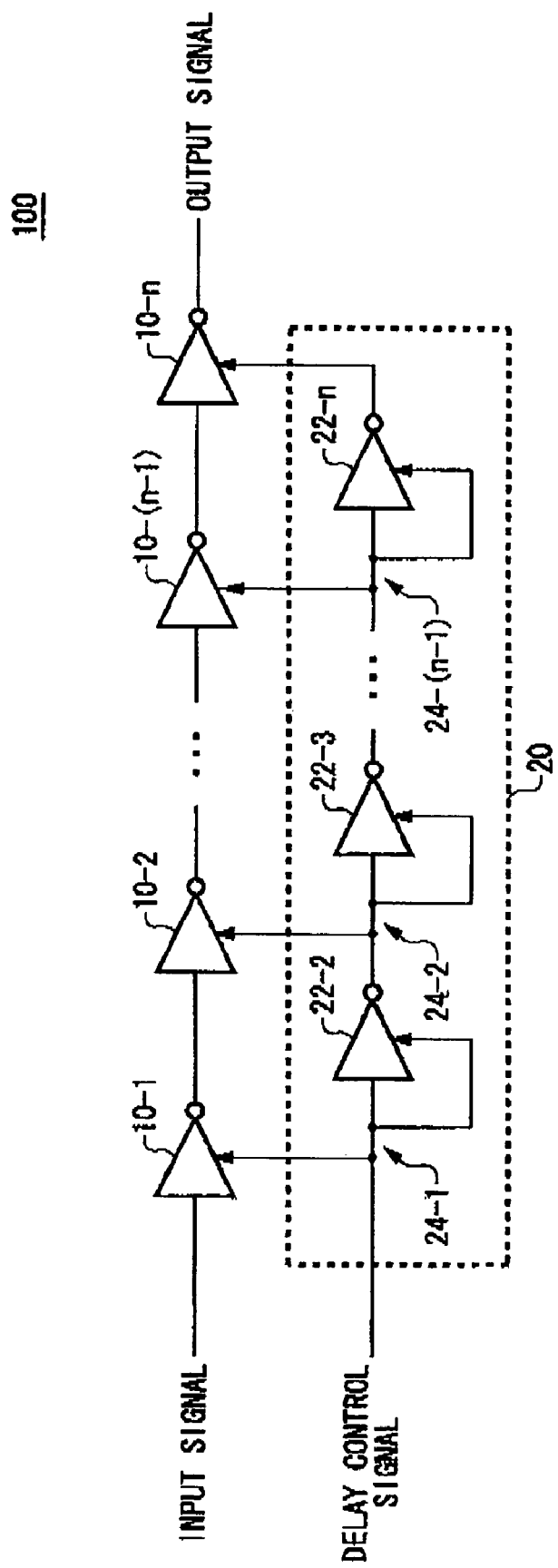
FIG. 2 is a view showing another example of a configuration of the delay circuit 100.

FIG. 2 is a view showing another example of a configuration of the delay circuit 100. The delay circuit 100 in the present example is a circuit that uses a delay element having a delay characteristic substantially equal to that of the delaying section 10 as the variable delay element 22 in the configuration of the delay circuit 100 described in FIG. 1. The other configuration is equal to that of the delay circuit 100 described in FIG. 1. La addition, the delay characteristic substantially equal to that of the delaying section 10 means that a delay substantially equal to that of the delaying section 10 is performed when the delay control signal equal to that of the delaying section 10 is given.

By such a configuration, it is possible to easily and substantially equally control a phase between an input signal and a delay control signal being input into each of the delaying sections 10.

Figure 3:
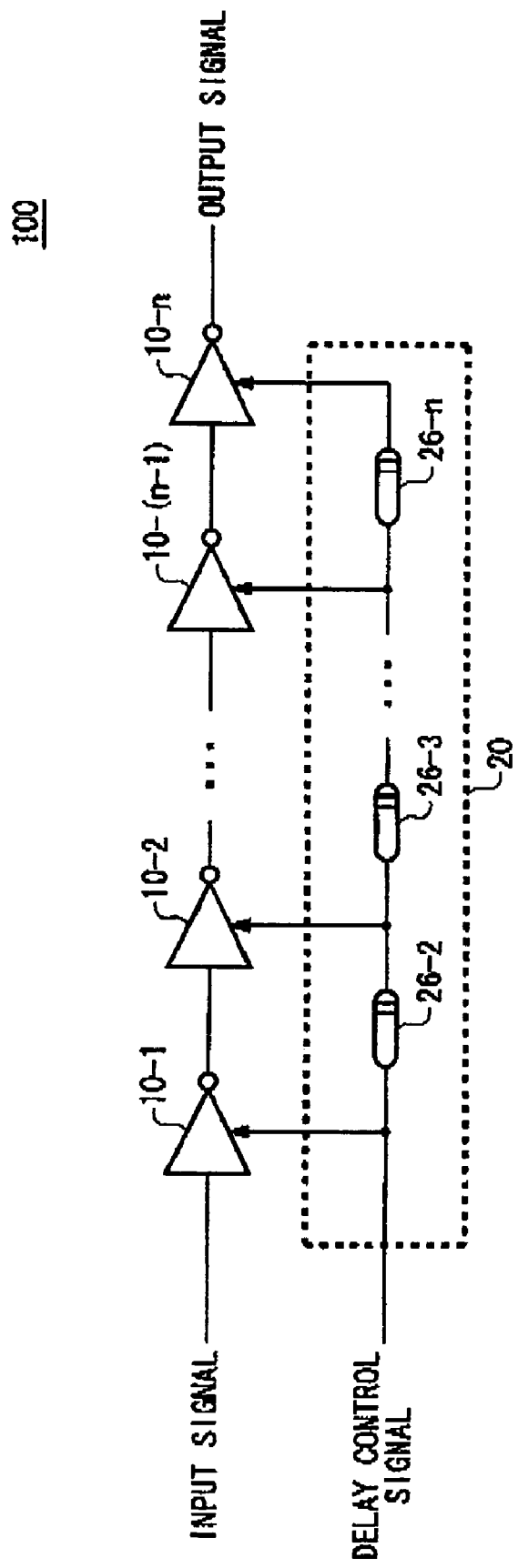
FIG. 3 is a view showing another example of a configuration of the delay circuit 100.

FIG. 3 is a view showing another example of a configuration of the delay circuit 100. The delay circuit 100 in the present example is a circuit that uses a fixed delay element 26 in place of the variable delay element 22 in the configuration of the delay circuit 100 described in FIG. 1. The fixed delay element 26 delays the delay control signal by a predetermined fixed time delay. Moreover, the delay circuit 100 in the present example does not have the splitter section 24 for controlling a time delay of the fixed delay element 26. The time delay of the fixed delay element 26 may be, for example, the generally same as a reference time delay of the delaying section 10.

By such a configuration, it is possible to reduce a phase difference between an input signal and a delay control signal being input into each of the delaying sections 10.

Figure 4:
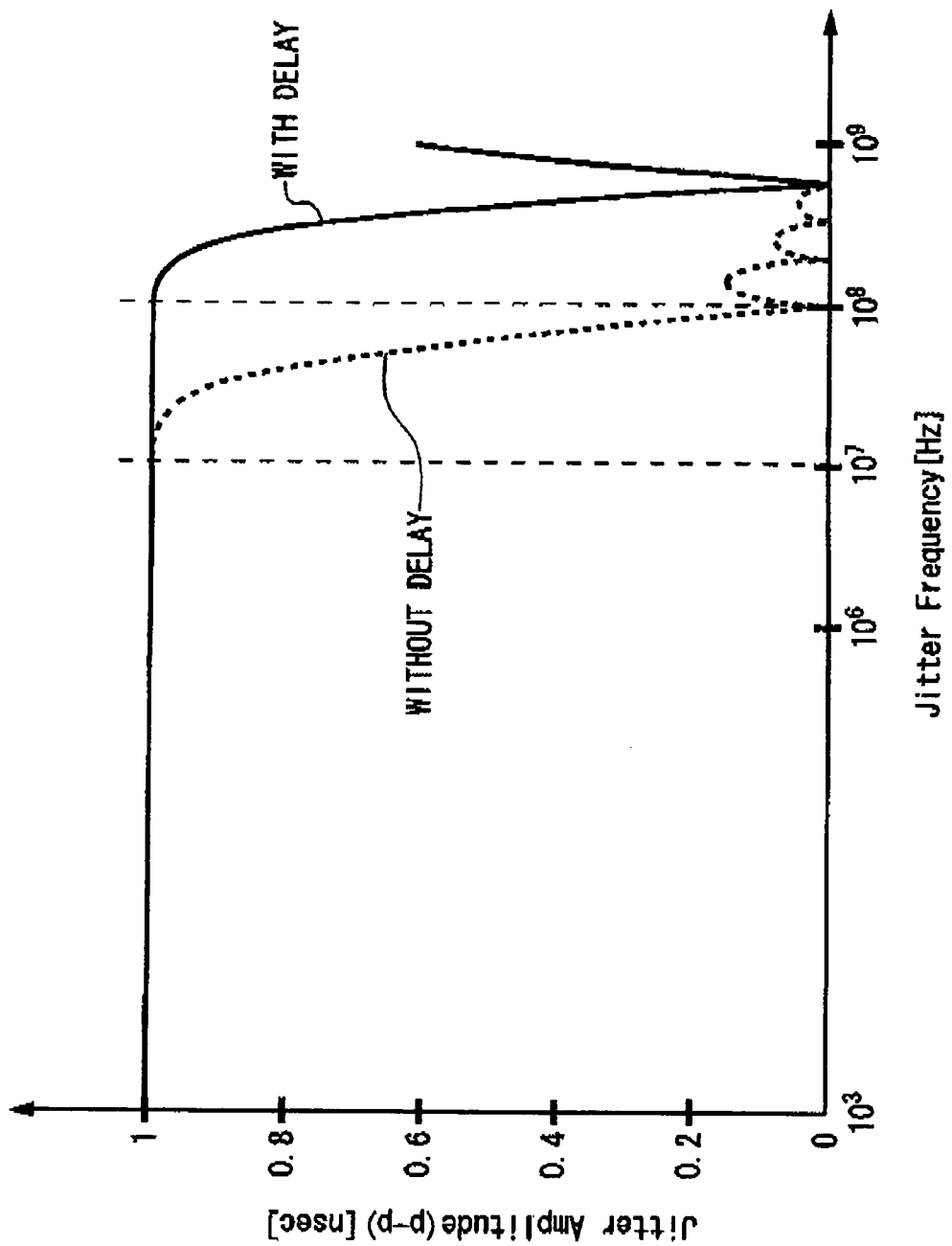
FIG. 4 is a view exemplary showing a relationship between frequency of a jitter injected into an input signal by the delay circuit 100 and a peak-to-peak value of the jitter in an output signal.

FIG. 4 is a view exemplary showing a relation between frequency of jitter injected to an input signal by the delay circuit 100 and a peak-to-peak value of the jitter in an output signal. In the delay circuit 100 in the present example in regard to the delay circuit 100 described in FIG. 3, assuming that the number of stages of the delaying sections 10 is text and a reference time delay for each of the delaying sections 10 is 1000 psec. Jitter having amplitude of 1000 psec (p-p) is injected by means of this delay circuit 100. In other words, the jitter having amplitude of 100 psec (p-p) per one stage of the delaying sections 10 is injected.

Moreover, in FIG. 4, a jitter injected by means of the delay circuit 100 without the fixed delay element 26 and a jitter injected by means of the delay circuit 100 with the fixed delay element 26 are compared.

When using the delay circuit 100 without the fixed delay element 26, the amplitude of jitter being injected becomes smaller than 1000 psec for the jitter frequency greater than 10 MHz, and the amplitude of jitter becomes zero for the jitter frequency greater 100 MHz. The reason is that a time delay in a positive direction and a time delay in a negative direction with respect to a reference time delay occur in each of the delaying sections 10 are canceled with each other.

On the other hand, when using the delay circuit 100 having the fixed delay element 26, it is possible to inject jitter of large amplitude of higher jitter frequency.

Figure 5:
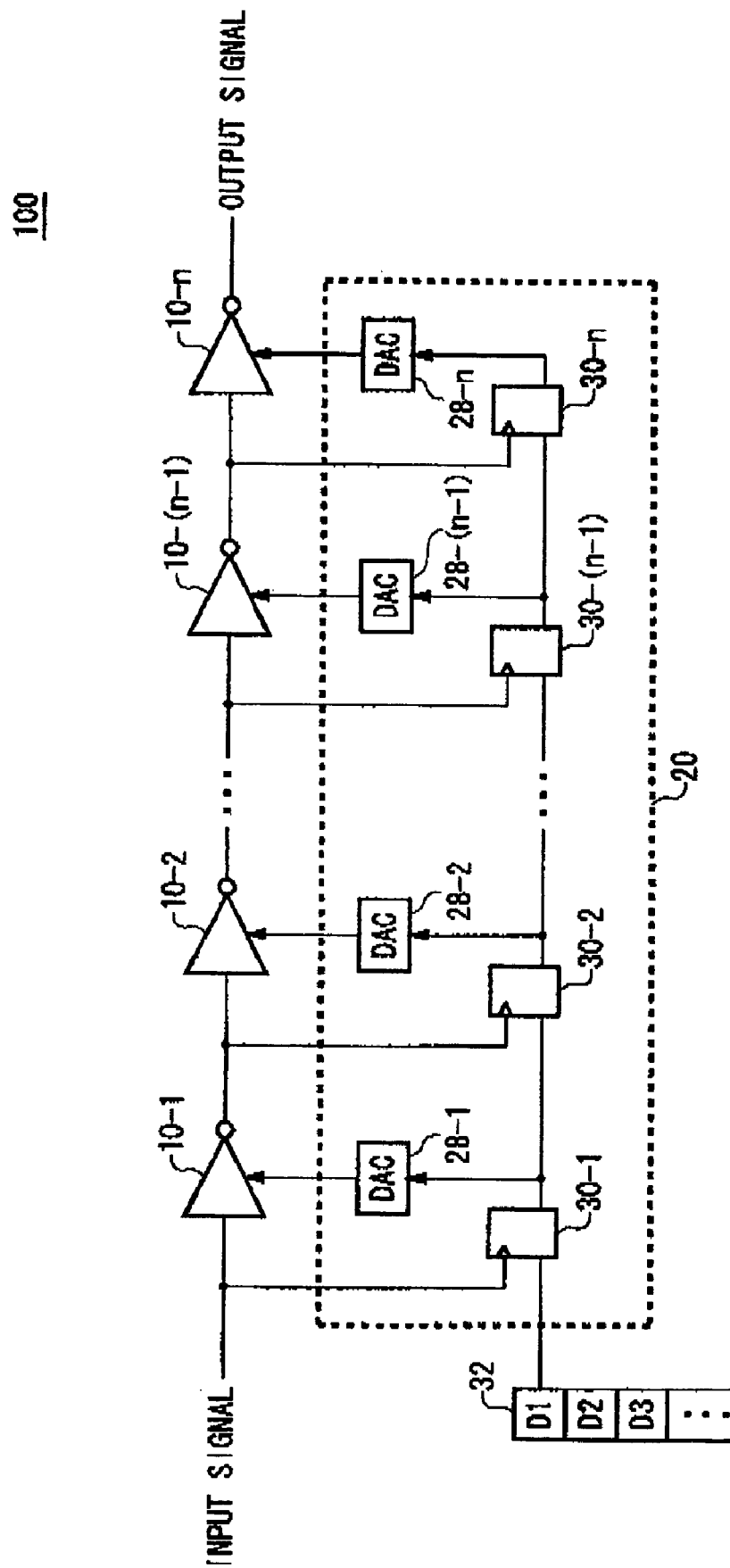
FIG. 5 is a view showing another example of a configuration of the delay circuit 100.

FIG. 5 is a view showing another example of a configuration of the delay circuit 100. The delay circuit 100 in the present example includes a plurality of delaying sections 10 (a first delaying section 10-1, a second delaying section 10-2, . . . , an nth delaying section 10-n, and n is an integer number not less than two) and a delay setting section 20. The plurality of delaying sections 10 is equal to the delaying section 10 described with reference to FIG. 1.

The delay setting section 20 has a plurality of flip-flops 30 (a first flip-flop 30-1, a second flip-flop 30-2, . . . , an nth flip-flop 30-n) and a plurality of DACs (a first DAC 28-1, a second DAC 28-2, . . . , an nth DAC 28-n) that are provided corresponding to the plurality of delaying sections 10 with one-to-one correspondence.

Each of the flip-flops 30 sets a time delay of the corresponding delaying section 10 based on a digital delay control signal. Moreover, each of the flip-flops 30 sets a time delay in the corresponding delaying section 10 at the timing delayed by a predetermined time after the preceding flip-flop 30 sets a time delay.

The flip-flops 30 in the present example are provided in a cascaded manner. Digital delay control signals (D1, D2 . . . ) are sequentially given to the first flip-flop 30-1 at the first stage. Each of the flip-flops 30 acquires and outputs a delay control signal output from the previous flip-flop 30 according to a given timing signal.

Moreover, each of the flip-flops 30 is supplied with a timing signal obtained by delaying a timing signal given to the preceding flip-flop 30 by a predetermined time. In this example, each of the flip-flops 30 is supplied with an input signal being input into the corresponding delaying section 10 as this timing signal. Since input signals being input into each of the delaying sections 10 are sequentially delayed, each of the flip-flops 30 is supplied with a thing signal obtained by delaying the timing signal given to the preceding flip-flop 30 of this flip-flop 30.

Each of the DACs 28 converts a delay control signal output from the corresponding flip-flop 30 into an analog signal to supply the converted signal to the corresponding delaying section 10. For example, when a time delay of the delaying section 10 vanes with a power supply voltage, the DAC 28 converts the delay control signal into an analog voltage and supplies the converted voltage as a power supply voltage of the corresponding delaying section 10. Moreover, when a time delay of the delaying section 10 is controlled according to a digital delay control signal, the delay setting section 20 may not have the DAC 28.

By such a configuration, it is possible to reduce a phase difference between an input signal and a delay control signal being input into each of the delaying sections 10.

Figure 6:
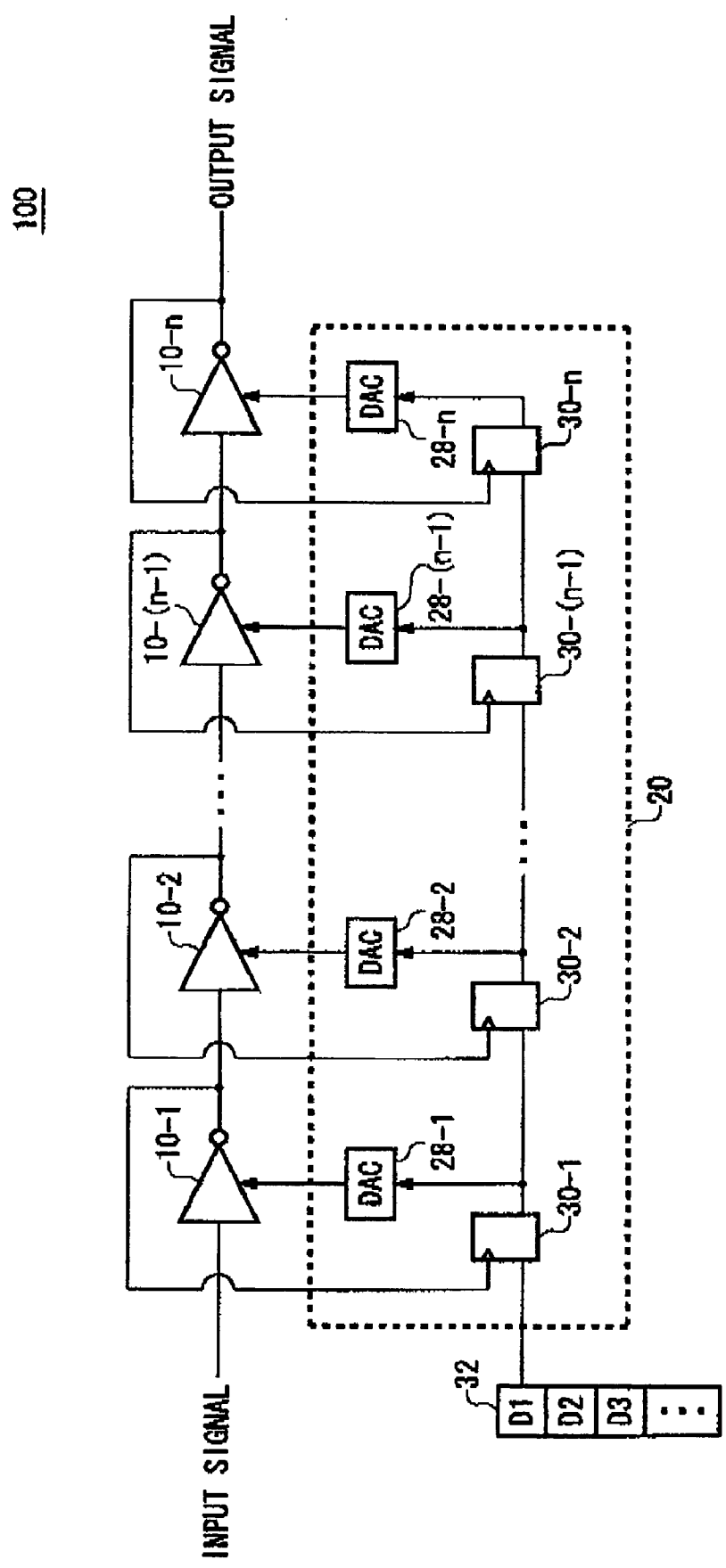
FIG. 6 is a view showing another example of a configuration of the delay circuit 100.

FIG. 6 is a view showing another example of a configuration of the delay circuit 100. The delay circuit 100 in the present example bas a configuration similar to that of the delay circuit 100 shown in FIG. 5. In other words, in the delay circuit 100 described in FIG. 5, an input signal being input into the corresponding delaying section 10 is given as a timing signal for each of the flip-flops 30. On the contrary, in the delay circuit 100 in the present example, an input signal output from the corresponding delaying section 10 is given as a timing signal for each of the flip-flops 30

By such a configuration, each of the flip-flops 30 can set a time delay to be generated for the next pulse after the corresponding delaying section 10 delays and outputs a pulse of an input signal. For this reason, it is possible to control a time delay in each of the delaying sections 10 with higher accuracy.

Figure 7:
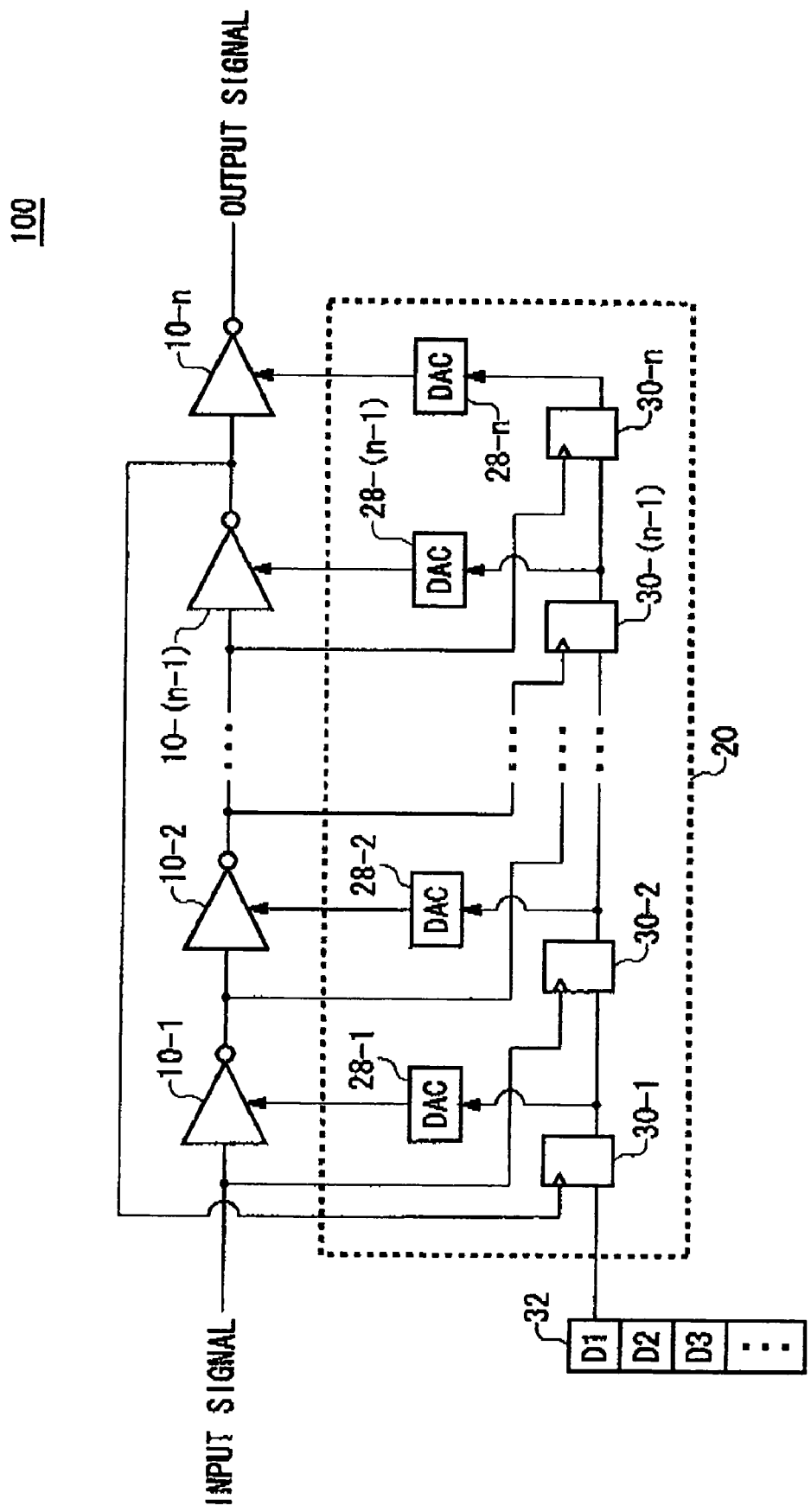
FIG. 7 is a view showing another example of a configuration of the delay circuit 100.

FIG. 7 is a view showing another example of a configuration of the delay circuit 100. The delay circuit 100 in the present example has a configuration similar to that of the delay circuit 100 shown in FIG. 5. In other words, in the delay circuit 100 illustrated in FIG. 5, an input signal being input into the corresponding delaying section 10 is given as a timing signal of each of the flip-flops 30. Correspondingly, in the delay circuit 100 in the present example, an input signal being input into the not-corresponding delaying section 10 is given as a timing signal of each of the flip-flops 30.

At this time, it is preferable that an input signal being input into the adjacent delaying section 10 is given to the adjacent flip-flop 30 as each timing signal. Moreover, it is preferable that an input signal being input into more preceding delaying section 10 is given to more preceding flip-flop 30. For example, when an input signal to the m-th delaying section 10-m is given to the k-th flip-flop 30-k as a timing signal, an input signal to the (m−1)th delaying section 10-(m−1) is given to the (k−1)th flip-flop 30(k−1) as a timing signal.

However, when the k-th flip-flop 30-k receives an input signal to the first delaying section 10-1 as a timing signal, the (k−1)th flip-flop 30-(k−1) receives an input signal to the last delaying section 10-n as a timing signal.

By such a configuration, it is possible to reduce a phase difference between an input signal and a delay control signal being input into each of the delaying sections 10.

Figure 8:
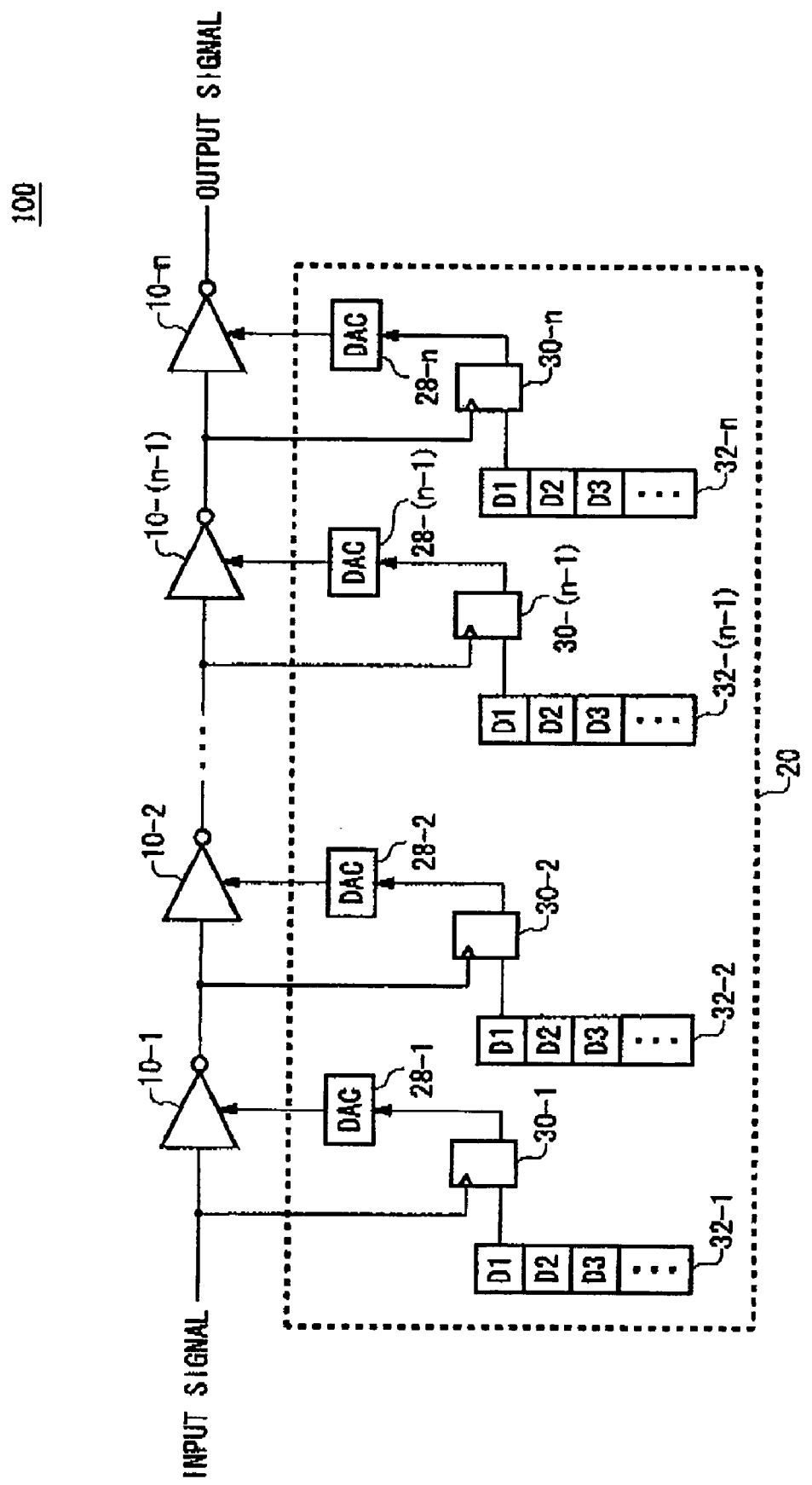
FIG. 8 is a view showing another example of a configuration of the delay circuit 100.

FIG. 8 is a view showing another example of a configuration of the delay circuit 100. The delay circuit 100 in the present example has a plurality of registers 32 corresponding to the plurality of flip-flops 30 with one-to-one correspondence, in regard to a configuration of the delay circuit 100 described in FIG. 5. Moreover, in the configuration of the present example, each of the flip-flops 30 is not interconnected. Each of the registers 32 stores digital data for the same delay control signal and sequentially supplies the data to the corresponding flip-flop 30.

The other configuration is equal to that of the delay circuit 100 described in FIG. 5. By such a configuration, it is possible to reduce a phase difference between an input signal and a delay control signal being input into each of the delaying sections 10.

Figure 9:
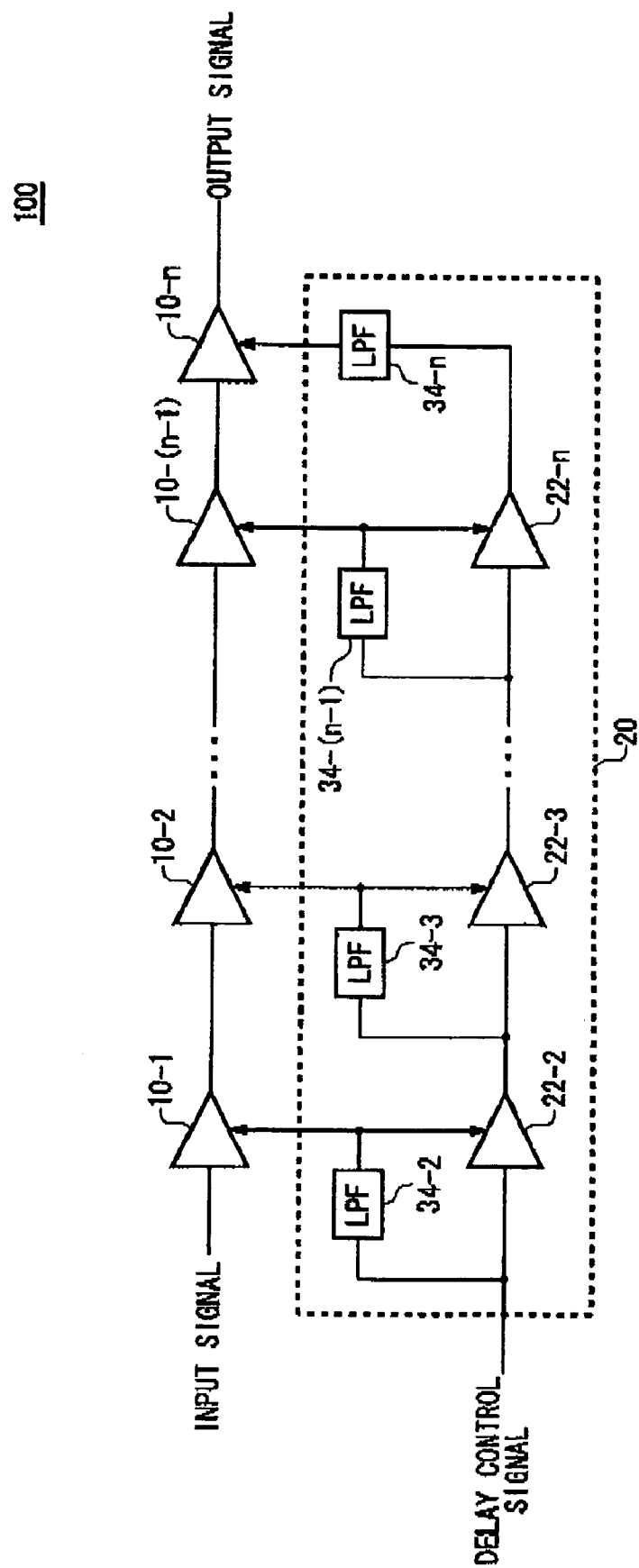
FIG. 9 is a view showing another example of a configuration of the delay circuit 100.

FIG. 9 is a view showing another example of a configuration of the delay circuit 100. The delay circuit 100 in the present example includes a plurality of delaying sections 10 and a delay setting section 20. The plurality of delaying sections 10 may be equal to the plurality of delaying sections 10 described with reference to FIG. 1.

The delay setting section 20 has a plurality of variable delay elements 22 and a plurality of low-pass filters 34. The plurality of variable delay elements 22 and the plurality of low-pass filters 34 are provided corresponding to the plurality of delaying sections 10 with one-to-one correspondence. However, the variable delay element 22 is not provided for the last delaying section 10.

The plurality of variable delay elements 22 receives a delay control signal, and sequentially delays and outputs the signal. Here, a delay control signal given to the delay circuit 100 is a square wave with a substantially constant period.

The plurality of low-pass filters 34 passes a predetermined low frequency components of a delay control signal being input into the corresponding delaying section 10. In the present example, the low-pass filter 34 receives the delay control signal being input into the corresponding variable delay element 22. However, the low-pass filter 34 of the final stage receives the delay control signal output from the preceding variable delay element 22.

For example, the low-pass filter 34 may pass a frequency component substantially equal to frequency of the delay control signal. In other words, the low-pass filter 34 outputs a sine waveform of frequency substantially equal to frequency of the delay control signal. The low-pass filter 34 controls a time delay in the corresponding delaying section 10 and variable delay element 22 based on this sine waveform.

In this way, in each of the delaying sections 10, sinusoidal jitter is injected to an input signal. Moreover, since the variable delay element 22 delays the delay control signal according to the time delay in the corresponding delaying section 10, it is possible to substantially uniform phases of an input signal and a delay control signal being input into each of the delaying sections 10.

Moreover, the delay circuit 100 described in FIGS. 1 to 9 may be formed of one semiconductor chip.

Figure 10:
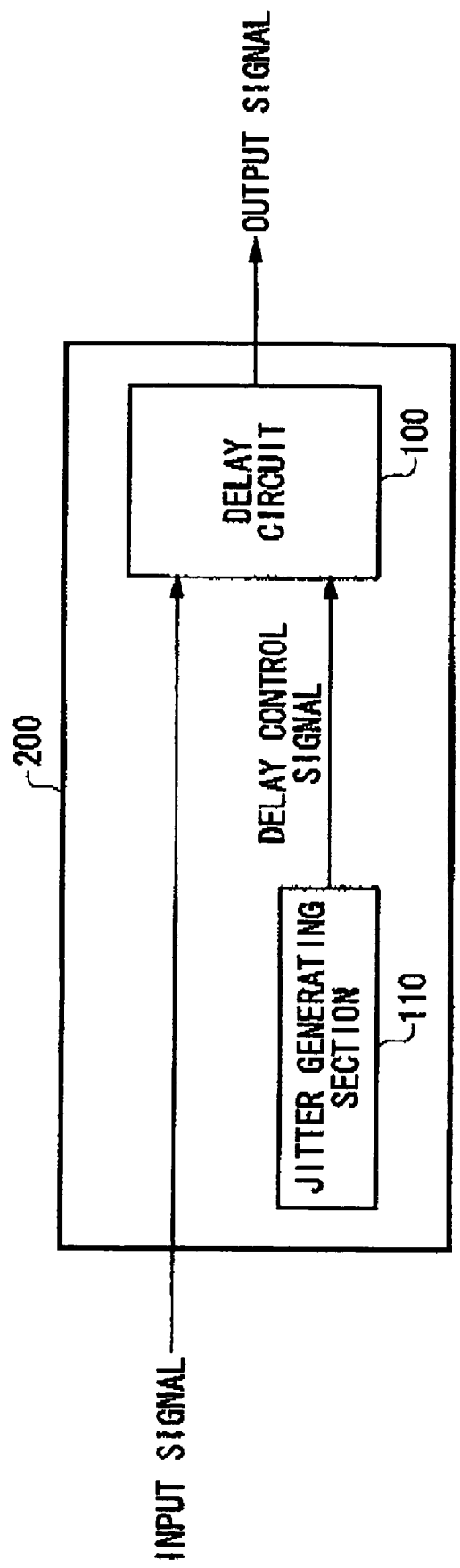
FIG. 10 is a view exemplary showing a configuration of a jitter injection circuit 200 according to one embodiment of the present invention.

FIG. 10 is a view exemplary showing a configuration of a jitter injection circuit 200 according to one embodiment of the present invention. The jitter injection circuit 200 is a circuit that injects jitter to an input signal to output the signal, and includes a delay circuit 100 and a jitter generating section 110. The delay circuit 100 is any one of the delay circuits 100 illustrated in FIGS. 1 to 9.

The jitter generating section 110 generates a delay control signal controlling a time delay in the delay circuit 100. This delay control signal is a delay control signal illustrated in FIGS. 1 to 9, and is generated according to jitter to be injected. For example, when sinusoidal jitter is injected to an input signal by means of the delay circuit 100 described in FIG. 1, the jitter generating section 10 generates a delay control signal of a sine waveform having desired frequency and amplitude.

Moreover, when the delay circuit 100 is a delay circuit 100 described in FIGS. 5 to 8, the jitter injection circuit 200 may not include the jitter generating section 110. In this case, the register 32 functions as the jitter generating section 110. Moreover, the jitter generating section 110 may have a function writing digital data of a delay control signal in the register 32. For example, when sinusoidal jitter is injected to an input signal, the jitter generating section 110 may generate digital data obtained by digitalizing a sine waveform having desired frequency and amplitude at a desired sampling rate.

By such a configuration, it is possible to inject jitter with high frequency and large amplitude to an input signal.

Figure 11:
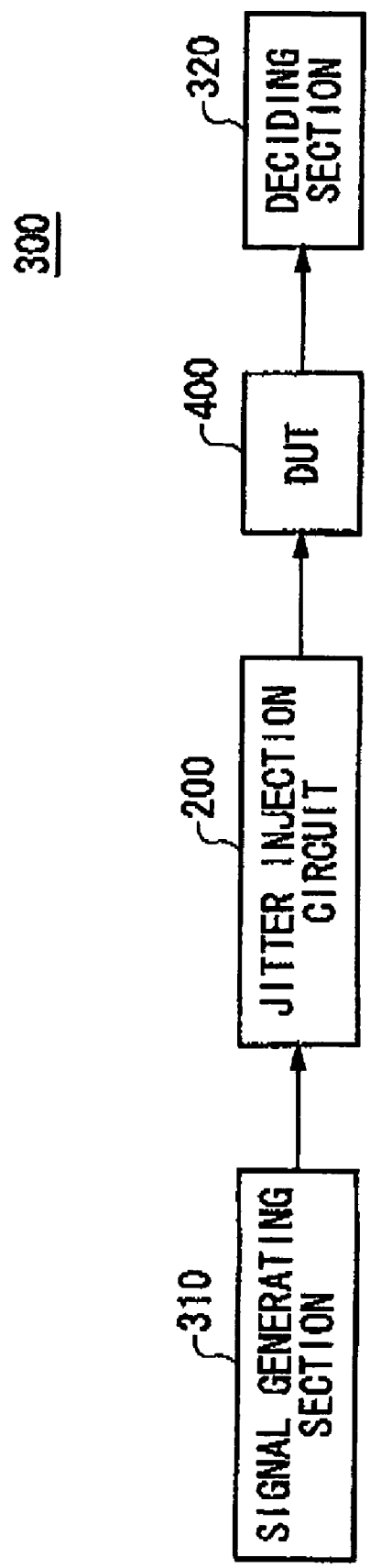
FIG. 11 is a view exemplary showing a configuration of a test apparatus 300 according to one embodiment of the present invention.

FIG. 11 is a view exemplary showing a configuration of a test apparatus 300 according to one embodiment of the present invention. The test apparatus 300 is an apparatus that tests a device under test 400 such as a semiconductor circuit, and includes a signal generating section 310, a jitter injection circuit 200, and a deciding section 320.

The signal generating section 310 generates a test signal to be input into the device under test 400. It is preferable that the signal generating section 310 generates a test signal without jitter. The jitter injection circuit 200 injects jitter to the test signal received from the signal generating section 310.

The deciding section 320 evaluates the device under test 400 based on a signal output from the device under test 400 according to the test signal. For example, the deciding section 320 may compare a signal output from the device under test 400 according to the test signal to which jitter with predetermined amplitude is injected and a predetermined expectation signal, and decide the good or bad of the device under test 400 based on a comparison result.

Moreover, the deciding section 320 may change amplitude of jitter to be injected to a test signal, and compare an output signal from the device under test 400 and a predetermined expectation signal for each of the jitter amplitude. In this case, the deciding section 320 may evaluate tolerance of the device under test 400 against jitter based on jitter amplitude when the output signal and the expectation signal are not identical with each other.

By such a configuration, it is possible to inject jitter with high frequency and large amplitude to a test signal to test the device under test 400.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to embodiments of the present invention, it is possible to inject jitter with high frequency and large amplitude to an input signal.

What is claimed is:

1. A delay circuit that delays and outputs a given input signal, comprising:
a first delaying section that delays the input signal to provide a first delayed signal;
a second delaying section that further delays the first delayed signal to provide a second delayed signal to be output from the delay circuit; and
a delay setting section that sets an amount of delay of the second delaying section to a predetermined amount based on an amount of delay of the first delaying section,
wherein the delay setting section is configured to provide a delay control signal, according to a desired time delay of the delay circuit, to the first delaying section and provide a delayed control signal to the second delaying section, and
wherein the delay setting section comprises a delay element that delays the delay control signal and provides it to the second delaying section.

2. The delay circuit as claimed in claim 1, wherein the delay element is a variable delay element that delays the delay control signal according to the time delay in the first delaying section.

3. The delay circuit as claimed in claim 2, wherein
the variable delay element has a delay characteristic substantially equal to that of the first delaying section, and
the delay setting section further has a splitter section that branches the delay control signal being supplied to the first delaying section and controls a time delay in the variable delay element based on the split delay control signal.

4. The delay circuit as claimed in claim 1, wherein the delay element is a fixed delay element that delays the delay control signal by a predetermined fixed time delay to supply the delayed control signal to the second delaying section.

5. A delay circuit that delays and outputs a given input signal, comprising:
a first delaying section that delays the input signal;
a second delaying section that further delays the input signal already delayed by the first delaying section; and
a delay setting section that sets a time delay provided by the second delaying section to a predetermined time delay with respect to a time delay provided by the first delaying section,
wherein the delay setting section comprises:
a first flip-flop that sets a time delay of the first delaying section based on a digital delay control signal; and
a second flip-flop that sets a time delay of the second delaying section based on the digital delay control signal.

6. The delay circuit as claimed in claim 5, wherein
the first flip-flop is configured to acquire the delay control signal according to a predetermined timing signal and output the acquired delay control signal to the first delaying section, and
the second flip-flop is configured to acquire the delay control signal according to the timing signal delayed by a predetermined time and output the acquired delay control signal to the second delaying section.

7. The delay circuit as claimed in claim 6, wherein the second flip-flop is configured to acquire the delay control signal output from the first flip-flop according to the timing signal delayed by the predetermined time.

8. The delay circuit as claimed in claim 7, wherein
the first flip-flop receives the signal being input into the first delaying section as the timing signal, and
the second flip-flop receives the signal being input into the second delaying section as the timing signal.

9. The delay circuit as claimed in claim 6, wherein
the first flip-flop receives the signal output from the first delaying section as the timing signal, and
the second flip-flop receives the signal output from the second delaying section as the timing signal.

10. A jitter injection circuit that injects and outputs jitter to an input signal, comprising:
a delay circuit that delays and outputs the input signal; and
a jitter generating section that generates a delay control signal controlling a time delay in the delay circuit according to jitter to be injected to the input signal,
the delay circuit comprising:
a first delaying section that delays the input signal by a time delay according to the delay control signal;
a second delaying section that further delays the input signal delayed by the first delaying section by the time delay according to the delay control signal; and
a delay setting section that sets a time delay in the second delaying section at a timing delayed by a predetermined time with respect to a timing at which a time delay in the first delaying section is set.

11. A test apparatus that tests a device under test, comprising:
a signal generating section that generates a test signal to be input into the device under test;
a jitter injection circuit that injects jitter to the test signal to input the injected signal into the device under test; and
a deciding section that evaluates the device under test based on a signal output from the device under test according to the test signal,
the jitter injection circuit comprising:
a delay circuit that delays and outputs the test signal; and
a jitter generating section that generates a delay control signal controlling a time delay in the delay circuit according to jitter injected to the test signal,
wherein the delay circuit comprises:
a first delaying section that delays the test signal by a time delay according to the delay control signal;
a second delaying section that further delays the test signal delayed by the first delaying section by the time delay according to the delay control signal; and
a delay setting section that sets a time delay in the second delaying section at a timing delayed by a predetermined time with respect to a timing at which a time delay in the first delaying section is set.

* * * * *